United States Patent [19]

Nogawa et al.

[11] 4,316,320
[45] Feb. 23, 1982

[54] METHOD OF MANUFACTURING ELECTRONIC CIRCUIT APPARATUS

[75] Inventors: Kenji Nogawa, Izumi; Katsuyoshi Takemura, Hirakata; Yoshifumi Okada, Neyagawa, all of Japan

[73] Assignee: Matsushita Electric Industrial Co., Ltd., Kadoma, Japan

[21] Appl. No.: 85,055

[22] Filed: Oct. 15, 1979

[30] Foreign Application Priority Data

Oct. 13, 1978 [JP] Japan ............................... 53-126691
Oct. 13, 1978 [JP] Japan ............................... 53-126692

[51] Int. Cl.³ .............................................. H05K 3/34
[52] U.S. Cl. ........................................ 29/839; 29/832; 29/835; 174/52 PE; 174/52 FP; 228/179; 228/180 A; 427/271; 427/284
[58] Field of Search ................ 29/831, 832, 825, 835, 29/836, 834, 827, 839; 156/625, 248; 427/271, 272, 284, 282; 228/179, 180 R, 180 A; 174/52 PE; 357/70

[56] References Cited

U.S. PATENT DOCUMENTS

| 3,440,027 | 4/1969 | Hugle | 174/52 PE X |
| 3,724,068 | 4/1973 | Galli | 228/180 A X |
| 3,831,252 | 8/1974 | Miller | 228/180 A X |
| 3,888,745 | 6/1975 | Hojyo | 204/15 |
| 3,908,075 | 9/1975 | Jackson et al. | 357/70 X |
| 3,968,563 | 7/1976 | Hamlin | 228/180 A X |
| 4,050,618 | 9/1977 | Angelucci, Sr. et al. | 228/180 A X |
| 4,234,666 | 11/1980 | Gursky | 357/70 X |

Primary Examiner—Francis S. Husan
Assistant Examiner—C. J. Arbes
Attorney, Agent, or Firm—Wenderoth, Lind & Ponack

[57] ABSTRACT

This is directed to an electronic circuit apparatus using a flexible printed wiring board having a conductive leaf formed on the surfaces of a flexible base material such as phenol resin or the like, wherein a circuit conductive leaf is formed on at least the single face of a flexible base material and a peripheral edge leaf is formed on the periphery of the flexible base material. An electronic parts is mounted and connected to the circuit conductive leaf. Since the flexible base material is extremely thin and flexible, the electronic circuit apparatus can be constructed smaller and thinner.

5 Claims, 8 Drawing Figures

METHOD OF MANUFACTURING ELECTRONIC CIRCUIT APPARATUS

The present invention relates to an electronic circuit apparatus using flexible printed wiring board, which is made by formation of a conductive layer on the surfaces of a flexible base material such as phenol resin or the like and to a method of manufacturing the electronic circuit aparatus.

In recent years, flexible printed wiring boards using flexible and thin base materials and being for use in electronic circuits for electronic appliances have been considered as being useful to make the electronic appliances smaller in size.

Since the flexible printed wiring board using such a flexible base material may be as thin as 0.02 to 0.3 mm and furthermore is flexible, a thin electronic circuit apparatus can be made therefrom and the flexible printed wiring board can be bent to be engaged with the appliance. Accordingly, such an electronic circuit apparatus using a flexible printed wiring board can be made extremely small in size as compared with a conventional electronic circuit apparatus using a rigid base material. However, there are disadvantages such that the flexible base material often tends to contract by itself and the size thereof may vary due to the construction and thus crack by itself.

Accordingly, a principal object of the present invention is to provide an electronic circuit apparatus using a flexible printed wiring board having a conductive layer formed on the surfaces of a flexible base material and a method of manufacturing the electronic circuit apparatus.

Another object of the present invention is to provide an electronic circuit apparatus which can eliminate the disadvantages of the conventional ones, and can be made extremely small in size, since the flexible base material is extremely thin, and yet have sufficient strength to be used where desired.

A further object of the present invention is to provide a method of manufacturing the electronic circuit apparatus, wherein electronic circuit apparatuses can be continuously manufactured from a band-shaped flexible printed wiring element, can be automatically manufactured by an automatic machine or can be automatically manufactured partially.

According to the present invention, there is provided an electronic circuit apparatus wherein a conductive circuit layer is formed on at least one face of a flexible base material, a peripheral layer is formed around the periphery of the flexible base material and electronic parts are mounted on and connected to said conductive circuit layer. Also, there is provided a method of manufacturing an electronic circuit apparatus comprising the steps of forming a conductive circuit layer surrounded by a frame, by an etching operation, on a band-shaped flexible printed wiring element having a conductive layer provided across the entire area of at least one face of the flexible base material; forming a peripheral edge layer between said frame and the conductive circuit layer; mounting and connecting electronic parts to said circuit conductive leaf; and cutting along a cutting line which has been set in advance between said frame and the peripheral edge leaf. In a preferred embodiment of the present invention, there is provided a method of manufacturing an electronic circuit apparatus comprising the steps of sequentially forming a circuit conductive layer surrounded by a frame, through an etching operation, on a band-shaped flexible printed wiring element having a conductive layer provided, across the entire face, on at least the single face of the flexible base material; in advance setting a cutting line to be cut, as a flexible printed wiring board, on the inner side of said frame; providing a tangential cut line partially on said cutting line by a first cutting process; positioning an electronic parts on said cutting line to connect to the circuit conductive leaf; and cutting the other cutting line except for said tangential cut line at a second cutting process to manufacture the electronic circuit apparatus separated from said flexible printed wiring element.

These and other objects, features, aspects and advantages of the present invention will become more apparent from the following detailed description of the present invention when taken in conjunction with the accompanying drawings in which.

Before the description of the present invention proceeds, it is to be noted that like parts are designated by like reference numerals throughout the several views of the accompanying drawings.

Figure 1:
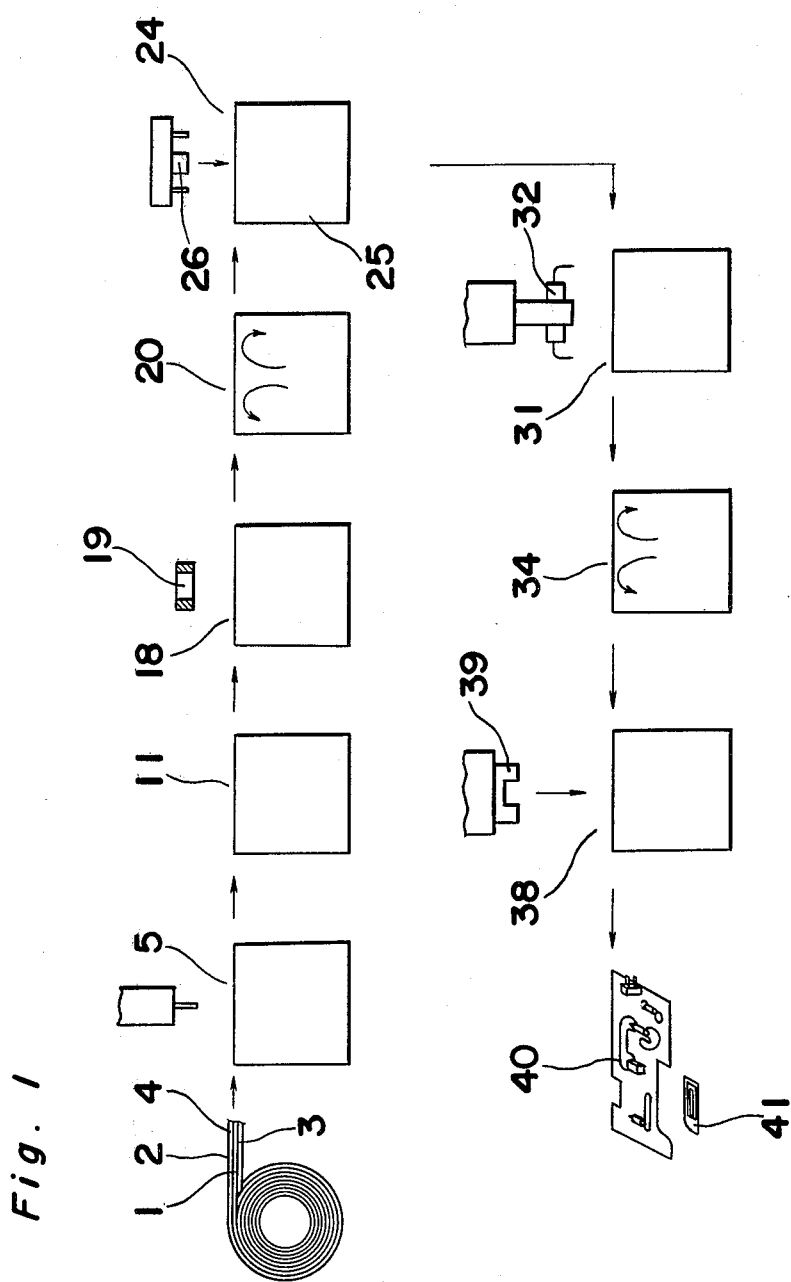
FIG. 1 is a block diagram of flow chart for explaining the process steps for manufacturing an electronic circuit apparatus according to one embodiment of the present invention.

Referring to FIG. 1, a flexible printed wiring element 4 or a flexible printed circuit sheet is provided having conductive layers 2 and 3 or sheets or films of conductive materials such as copper formed on and adhered to, respectively, the entire area of both surfaces of a band-shaped flexible insulating base material 1 such as a flexible tape made of phenol resin with thickness of 0.02 to 0.3 mm. The flexible printed circuit sheet 4 is sequentially delivered to a piercing process step 5 having a press for forming guide holes 6 and 7 of uniform constant size at equal intervals by a pressing operation or the like on both longitudinal side portions of the sheet 4 during the piercing process step 5 and at the same time, holes 8 for inserting the lead wires of electronic parts having leads and small holes 9a, 9b, 10a, 10b, etc., for a cutting operation of the sheet 4 to be described later, are formed on the intermediate portions of the sheet 4 by the pressing operation. Then the flexible printed circuit sheet 4 is delivered to an etching process step 11 by a sprocket wheel (not shown), etc. engaged in the guide holes 6 and 7 in a known manner. During the etching process step, a first circuit pattern 13 and a second circuit pattern 14 of given shapes are formed by etching, to remove the unnecessary portions of the conductive layers 2 and 3 on the front side and on the reverse side of the conductive sheet, at positions within an area defined within a periphery 12 having the same configuration on both sides of the sheet 4 and in the area between the longitudinally extending lines of guide holes 6 and 7. Also, a third circuit pattern having bar-shaped portions is formed, as shown in FIG. 2, outside of the periphery 12 on the front side of the sheet 4 by the etching operation.

The circuit patterns 13 and 14 have peripheral edge circuit elements 16 and 17 (the edge circuit element 17 is shown by a broken line in FIG. 4 and FIG. 5) on the opposite sides of the sheet 4 by the etching operation and extending along the entire or substantially the entire periphery of the area occupied by the circuit patterns 13 and 14 and spaced inwardly from the periphery 12. The circuit patterns 13 and 14 are formed inside an are surrounded by gaps in the conductive material between them. The peripheral edge circuit elements 16 and 17 provided on both sides of the sheet 4 have almost the same configurations and reinforce with the thickness of the peripheral edge of the base material 1 of an electronic circuit apparatus 40 to be cut from the element 4 by a method comprising the steps as described hereinafter.

Figure 2:
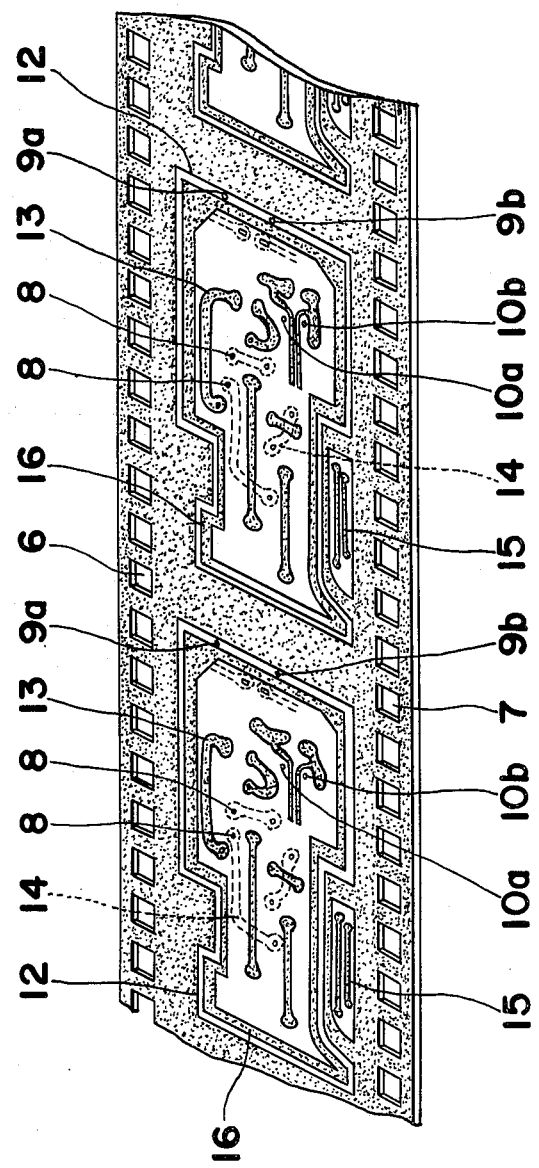
FIG. 2 is a perspective view of a flexible printed wiring element showing conductive circuit layers formed in sequence according to the present invention.
Figure 3:
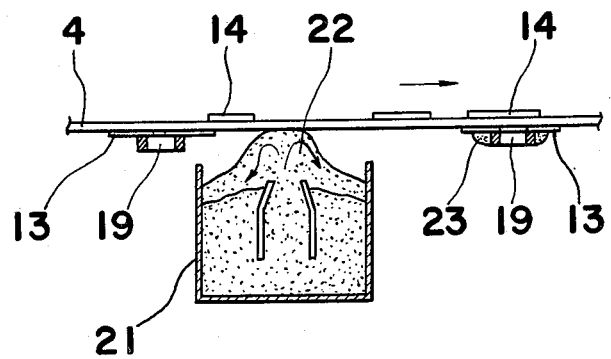
FIG. 3 is a schematic side elevational view of a solder cell showing how a soldering operation is performed in a first soldering process step.

The flexible printed circuit sheet 4, wherein such circuit patterns 13 and 15 as shown in FIG. 2 are sequentially provided is delivered to a first parts mounting process step 18, where leadless electronic parts 19 are tentatively mounted and bonded onto the front side of the sheet 4 at required locations in a known manner. In the first parts mounting process step 18, the leadless electronic parts are mounted only on the first circuit pattern 13 and/or the third circuit pattern 15 on the front side of the sheet 4. The flexible printed circuit sheet 4 to which the leadless electronic parts 19 are connected is delivered to a first soldering process step 20. In the first soldering process step 20, the flexible printed circuit sheet 4 is delivered in the direction of an arrow shown in FIG. 3 while the front side of the flexible printed circuit sheet 4 is being covered with the solder 22 of a solder cell 21 in a known manner, so that the leadless electronic parts 19 are soldered by the solder 22 onto the first circuit pattern 13 and/or the third circuit pattern 15.

In this case, the lead inserting holes 8 into which the electronic parts with leads thereon, switches or the terminals of other parts are inserted are processed in advance in a known manner so as not to be clogged with the solder 22.

Then, the flexible printed circuit sheet 4 processed in the first soldering process step 20 is delivered to a first cutting process step 24. The first cutting process step 24 is adapted to partially cut the flexible printed circuit sheet 4 by the use of a base pedestal 25 and a cutter 26, and the cutter 26 is eaten into the flexible printed circuit sheet 4 to provide notch portions or linear cuts in the required locations.

Figure 4:
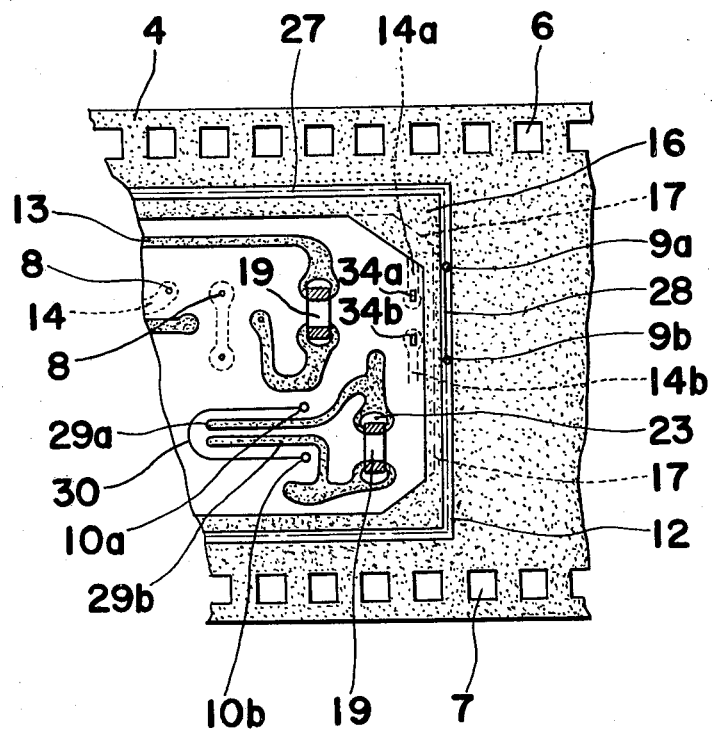
FIG. 4 is a top plan view of a portion of the flexible printed wiring element, on an enlarged scale, showing a peripheral cutting line.

The linear cuts are only provided by the cutter 26 at certain locations in the base material 1. A cutting line 27 along which the base material 1 of the electronic circuit apparatus 40 is later cut to separate the apparatus 40 from the flexible printed circuit sheet 4 extends along and adjacent the peripheral circuit elements 16 and 17, i.e., on the flexible base material 1 which is exposed between the periphery 12 and the peripheral circuit elements 16 and 17, and a first linear cut 28 is formed, as shown in FIG. 4, along the cutting line 27 between the small holes 9a and 9b formed in the required locations on the cutting line 27 for the mounting electronic parts 33. A second U-shaped linear cut 30 is formed between the small holes 10a and 10b around terminal leaves 29a and 29b forming part of the circuit pattern 13 for providing a cut and erected piece 42 for use in making an external connection.

Since the cuts 28 and 30 are adapted to be formed with an extremely narrow edge-cutter 26, the cuts 28 and 30, if they are formed, are adapted not to open, and the U-shaped portion is adapted not to bend down but to keep the same position as before it was cut.

Figure 5:
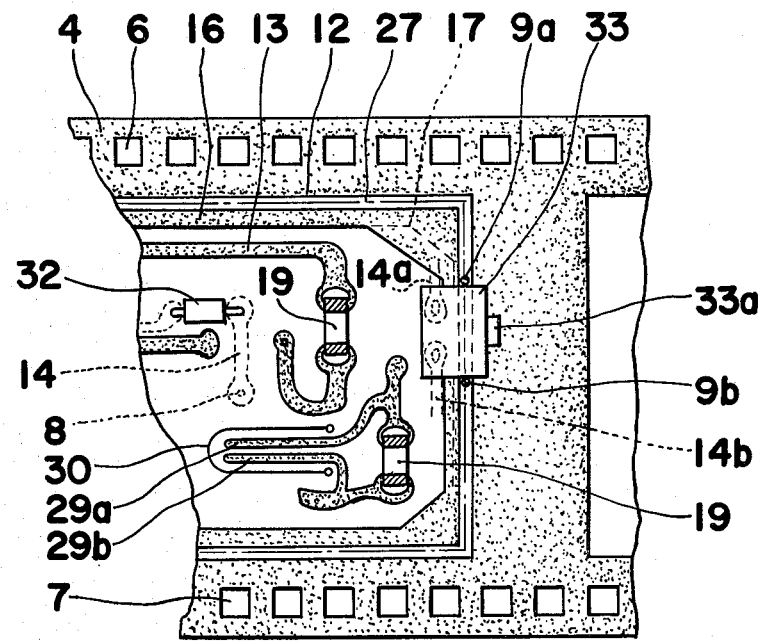
FIG. 5 is a view similar to FIG. 4 showing the flexible printed wiring element with electronic parts with leads or terminals mounted thereon.

The flexible printed circuit sheet 4 with the cuts 28 and 30 formed therein is delivered to a second parts mounting process step 31. As shown in FIG. 5, in the second parts mounting process step 31, an electronic part 32 with lead wires therein has the lead wires thereof inserted into the lead wire inserting holes 8 in the first circuit pattern 13 on the front side. Also, the electronic part 33 with terminals therein such as a switch, has the terminals inserted from the front side into the terminal receiving holes 34a and 34b. The electronic part 33 is positioned on the cut line 28 and the actuator 33a of the electronic part 33 projects outwardly from the cutting line 27 and the terminals are adapted to be connected to the end portions 14a and 14b of the second circuit pattern 14 on the reverse side.

Figure 6:
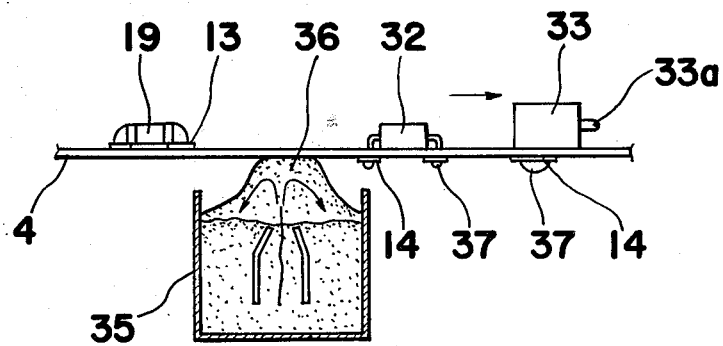
FIG. 6 is a schematic side elevational view showing a further solder cell and how the soldering operation is performed in a second soldering process step.

After the second parts mounting process step 31, the flexible printed circuit sheet 4 is delivered to a second soldering process step 34. As shown in FIG. 6, in the second soldering process step 34, the flexible printed circuit sheet 4 is delivered in the direction of the arrow in FIG. 6, while the reverse side of the flexible printed circuit sheet 4 is being covered with the solder 36 of the solder cell 35 in a known manner, with the result that the electronic part 32 having the lead wires therein and the electronic part 33 having the terminals are soldered to the second circuit pattern 14.

Since the cuts 28 and 30 are not opened, they do not let the solder go thereinto during the second soldering process step 34, and the solder does not come onto the front side through the cuts.

Figure 7:
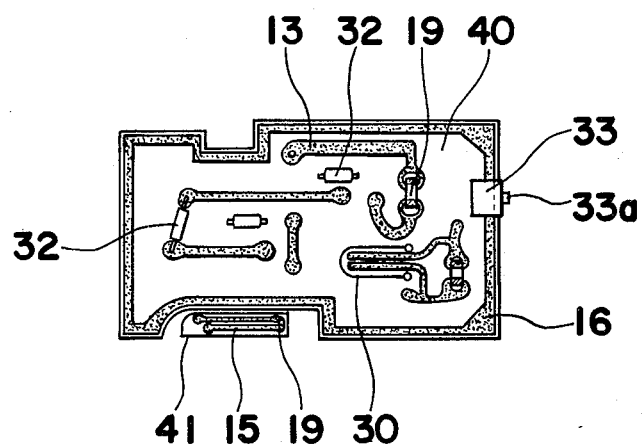
FIG. 7 is a top plan view of an electronic circuit apparatus manufactured in accordance with the present invention.

Electronic parts are sequentially mounted and connected to the first, second, third circuit patterns 13, 14 and 15 which are formed on the flexible printed circuit sheet 4 to continuously construct the electronic circuit apparatuses 40. After the second soldering process step 34, the flexible printed circuit sheet 4 is delivered to a second cutting process step 38. In the second cutting process step 38, the cutting operation is finally performed along the cutting line 27, which extends along and adjacent to the peripheral circuit elements, by a cutter 39, whereby two electronic circuit apparatuses 40 and 41 are respectively, provided as shown in FIG. 7.

At the second cutting process step 38, the base 1, with the exception of the cut 28 formed in the first cutting process step 24, is adapted to be cut through along the cutting line 27 by a cutter 39 as in the first cutting process step 24, so that the cut 28 formed in the first cutting process step 24 and the cut along line 27 formed in the second cutting process step 38 extend through the small holes 9a and 9b, whereby the electronic circuit apparatuses 40 and 41 are respectively separated from the flexible printed circuit sheet 4. The electronic circuit apparatuses 40 and 41 thus manufactured as described hereinabove are shown in FIG. 7.

Figure 8:
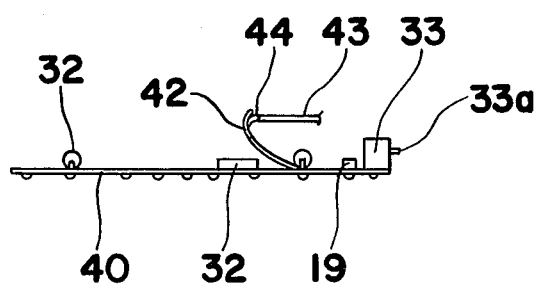
FIG. 8 is a side elevational view of the apparatus of FIG. 7 showing the external connecting means for the electronic circuit apparatus.

As shown in FIG. 8, a cut and erected piece 42 which can be bent up from the base portion of the sheet 4 from within the U-shaped cut 30 can be externally connected simply as a lead wire by soldering the terminal leaves 29a and 29b in an external connection to an external terminal 43 during the placing of the cut and erected piece into the electronic appliance. The cut and erected piece 42 is turned up to solder, a jumper wire to the first circuit pattern 13 or the second circuit pattern 14.

In the flexible printed circuit sheet 4, since tension is always kept applied upon the flexible base material 1 when the conductive layers 2 and 3 are applied upon the flexible base material 1, if the conductive layers 2 and 3 are removed, the flexible base material 1 tends to contract by itself. On the other hand, when each of the processes is automatically performed entirely or partially by an automatic machine, it is required to positively move the flexible printed circuit sheet 4 or to position it positively in a given position for the processes. Thus, according to the present invention, the guide holes 6 and 7 are positively engaged by a sprocket wheel or the like, and the guide holes 6 and 7 are positively reinforced by the conductive layers 2 and 3 remaining around the periphery 12. Thus, a positive and precise movement and the positioning operation are performed by means of the sprocket wheel in the guide holes 6 and 7.

Peripheral circuit elements 16 and 17 are provided around the circumference of the base material 1 of the electronic circuit apparatus 40 so that the size of the base material 1 will not vary due to contraction or expansion even in the electronic circuit apparatus 40 provided through the cutting operation, and cracks or the like will not occur in the base material 1 during the insertion into the electronic appliance. During the cutting process, if the cutting operation is performed through the conductive layers by the cutter, it may cause extreme wear of the cutting edge. Therefore, all the cuts are in positions from which the conductive layers have been removed by etching so that the cutting edges will cut the flexible base material 1 only.

Although in the above-described embodiment the first cutting process step 24 is provided after the first soldering process step 20, the first cutting process step may be provided after the etching process step 11. In addition, although the peripheral edge circuit elements 16 and 17 have been shown as being provided along the entire periphery, peripheral elements can be provided along the entire periphery on only one surface. The peripheral circuit elements can be provided on the front side and/or the reverse side, and either one of the peripheral circuit elements can be provided on the peripheral edge, and they can alternatively have a zigzag shape. Also each individual peripheral circuit element can extend only part way around the apparatus, the peripheral circuit elements on one side together extending substantially completely around the circuit patterns. They may serve as a grounding circuit element or the like for the circuit patterns. Accordingly, the electronic circuit apparatus 41 may be provided with the peripheral circuit elements or the circuit pattern on the reverse side as in the electronic circuit apparatus 40.

In the above-described embodiment, the conductive layers 2 and 3 are provided on both sides of the base, the flexible printed circuit sheet 4 is used and the circuit patterns 13 and 14 are formed on both sides of the sheet 4. The circuit pattern may be formed on one base only by providing the flexible printed circuit sheet 4 with the conductive layer on one face only. The lead wires of the electronic part or the terminals of electronic parts may be inserted from the reverse face of the element 4, where no circuit pattern is provided thereon, and be soldered. Also, in this case, the leadless electronic parts may be retained in a known manner by bonding or the like on the circuit pattern on the surface of the sheet 4 when inserting the terminals or the like of the electronic parts from the reverse face, thereby making it possible to collectively solder all the parts at once. In the case of where the conductive layer is on only one surface, the peripheral circuit elements may be provided on only the one face of the sheet 4.

According to the present invention, it is to be noted that the circuit pattern is formed on at least the front face of the flexible base material 1 as described hereinabove, the peripheral circuit elements are formed around the periphery of the flexible base material, and the electronic parts are mounted and connected to the circuit pattern provided within the peripheral circuit elements. Since the flexible base material 1 is extremely thin and flexible, the electronic circuit itself can be made small-sized and thin, thus contributing greatly towards a thinner and smaller electronic appliance. In addition, the peripheral circuit elements prevent the size variation, which is caused by the contraction of the flexible base material, and prevents cracks from being formed. Accordingly, the size of the circuit mounted on the electronic appliance will remain almost as originally made.

Also, the electronic circuit apparatus can be continuously manufactured simply from the band-shaped flexible printed wiring element, can be automatically manufactured sequentially, and can be automatically manufactured partially by an automatic machine. Thus, the manufacturing cost is lower.

When the electronic circuit apparatus is mounted inside the electronic appliance as an electronic circuit apparatus for the electronic appliance such as an ultra-small-sized tape recorder, radio or the like, simultaneously a switch operating piece, an external connecting terminal or the like can be easily projected from the operating portion of the appliance, thus resulting in extremely simplified assembling operation.

Furthermore, a small hole is provided in advance on a cutting line and the small hole is provided as a connection between the first cutting and the second cutting, so that the separating operation can be carried out if the positions of the cutting and the cutting line are offset slightly and the cracks can be prevented, thus resulting in a better apparatus.

Although the present invention has been described and illustrated in detail, it is to be clearly understood that the same is by way of limitation, the spirit and scope of the present invention being limited only by the terms of the appended claims.

What is claimed is:

1. A method of manufacturing a flexible printed circuit sheet for use in electrical and electronic equipment, which comprises the steps of:

providing a flexible base sheet having a belt-like configuration and a flexible base material with a layer of electrically conductive material covering the entire surface of at least one side of said flexible base material and having rows of guide holes at predetermined intervals along the opposite longitudinal edges of said base sheet;

forming electrically conductive circuit patterns on said base sheet at predetermined intervals in the longitudinal direction and at positions between the rows of said guide holes by removing electrically conductive material from said base sheet for leaving circuit elements constituting said circuit pattrns, said circuit patterns each occupying an area on said base sheet which has a periphery and including peripheral edge circuit elements extending along at least substantially the entire periphery of each area occupied by the respective circuit patterns and leaving electrically conductive material around the respective areas with the conductive material edge thereof spaced outwardly from the periphery of the respective areas, the electrically conductive material which is left on said base sheet extending to the base sheet edges and around said guide holes;

moving said flexible base sheet and positioning the circuit patterns successively at a parts attaching position by engagement of moving and positioning means in said guide holes and connecting electronic parts to the individual successive circuit patterns as the circuit patterns are successively positioned at said parts attaching position; and thereafter moving said base sheet for positioning successive circuit patterns in a cutting position and cutting individual flexible printed circuit sheets from said base sheet by cutting through said flexible base sheet on a line along and adjacent the edges of said peripheral edge circuit elements between said peripheral edge circuit elements and the conductive material edge left around the areas for separating the portions of said base sheet having said circuit patterns thereon from the remainder of said base sheet.

2. The method as claimed in claim 1 in which said peripheral edge circuit elements extend around the entire periphery of the area occupied by the circuit pattern in a continuous electric circuit.

3. A method as claimed in claim 1 in which each peripheral edge circuit element extends partially around the periphery of the area occupied by the corresponding circuit pattern, and the peripheral edge circuit elements of the corresponding circuit pattern together extend substantially entirely around the periphery of the said area.

4. The method as claimed in claim 1 in which said cutting step comprises making a cut along a part of said cutting line, and said step of connecting the electronic parts comprises connecting an electronic part in a position in which it extends across said cut, said cutting step further comprises then cutting the remainder of said cutting line.

5. The method as claimed in claim 4, in which said cutting step comprises first providing at least two small holes at spaced intervals along said cutting line, and forming said cut between said small holes.

* * * * *